United States Patent
Ma et al.

(10) Patent No.: US 8,381,800 B2
(45) Date of Patent: Feb. 26, 2013

(54) HEAT DISSIPATION DEVICE WITH TRIANGULAR GUIDING MEMBER

(75) Inventors: Xiao-Feng Ma, Shenzhen (CN); Zhen-Xing Ye, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 573 days.

(21) Appl. No.: 12/686,287

(22) Filed: Jan. 12, 2010

(65) Prior Publication Data

US 2011/0127012 A1 Jun. 2, 2011

(30) Foreign Application Priority Data

Nov. 27, 2009 (CN) .......................... 2009 1 0310583

(51) Int. Cl.
*F28F 7/00* (2006.01)
*F28D 15/00* (2006.01)
*H05K 7/20* (2006.01)
(52) U.S. Cl. ................... 165/80.3; 165/104.33; 361/700
(58) Field of Classification Search .................. 165/80.3; 361/700
See application file for complete search history.

(56) References Cited

U.S. PATENT DOCUMENTS

| 4,984,626 A * | 1/1991 | Esformes et al. ............ 165/151 |
| 6,741,468 B2 * | 5/2004 | Jing et al. ..................... 361/700 |
| 6,938,682 B2 * | 9/2005 | Chen et al. ............... 165/104.33 |
| 7,243,708 B2 * | 7/2007 | Lee et al. ................. 165/104.33 |
| 7,269,013 B2 * | 9/2007 | Chen et al. ..................... 361/700 |
| 7,304,847 B2 * | 12/2007 | Hwang et al. ................. 361/700 |
| 7,568,518 B2 * | 8/2009 | Li et al. ......................... 165/80.3 |
| 7,690,418 B2 * | 4/2010 | Chen et al. ..................... 165/80.3 |
| 2004/0017659 A1 * | 1/2004 | Jing et al. ....................... 361/700 |
| 2005/0190538 A1 * | 9/2005 | Huang .............................. 361/697 |
| 2006/0011329 A1 * | 1/2006 | Wang et al. ............... 165/104.33 |
| 2006/0219386 A1 * | 10/2006 | Hsia et al. ..................... 165/80.3 |
| 2007/0089869 A1 * | 4/2007 | Hwang et al. ................. 165/152 |
| 2007/0133151 A1 * | 6/2007 | Jeon et al. ....................... 361/600 |
| 2007/0144705 A1 * | 6/2007 | Chen et al. ..................... 165/80.3 |
| 2007/0188992 A1 * | 8/2007 | Hwang et al. ................. 361/700 |
| 2008/0017350 A1 * | 1/2008 | Hwang et al. ................. 165/80.3 |
| 2008/0121372 A1 * | 5/2008 | Zhou et al. .................... 165/80.3 |
| 2008/0135215 A1 * | 6/2008 | Wu ........................... 165/104.33 |
| 2008/0142194 A1 * | 6/2008 | Zhou et al. .................... 165/80.3 |
| 2010/0212876 A1 * | 8/2010 | Hancock ....................... 165/182 |

* cited by examiner

*Primary Examiner* — Brandon M Rosati
(74) *Attorney, Agent, or Firm* — Altis Law Group, Inc.

(57) ABSTRACT

A heat dissipation device includes a heat sink and a heat pipe extending through the heat sink. The heat sink includes a plurality of fins overlapped with each other. An air passage channel is defined between every two adjacent fins for an airflow flowing therethrough. Each of the fins defines a through hole therein for extension of the heat pipe. Each of the fins includes a main plate and an air guiding member formed on the main plate. The air guiding member includes a curved bar. The curved bar extends slantwise on the main plate to a back side of the heat pipe for guiding the airflow to the back side of the heat pipe.

10 Claims, 3 Drawing Sheets

HEAT DISSIPATION DEVICE WITH TRIANGULAR GUIDING MEMBER

BACKGROUND

1. Technical Field

The present disclosure relates to heat dissipation devices, and more particularly to a heat dissipation device for dissipating heat generated by electronic components of computers.

2. Description of Related Art

With the development of the electronic technology, some electronic components, for example, central processing units (CPUs), operate at faster and faster speeds, which causes the electronic components to generate redundant heat. If the heat is not quickly removed from the electronic components, stable and fast performances of the electronic components will not be sustained. Usually, people in the art install a heat dissipation device on a electronic component to help dissipating the heat of the electronic component.

A typical heat dissipation device includes a heat sink, a heat pipe extending through the heat sink, and a fan mounted on the heat sink. The heat sink includes a plurality of plate-shaped metallic fins overlapped with each other at a constant interval. An air passage channel is defined between every two adjacent fins. Each of the fins defines a through hole therein. The heat pipe includes an evaporation section and a condensation section at two opposite end thereof. The evaporation section of the heat pipe is thermally contacted with the electronic component to absorb heat therefrom, and the condensation section of the heat pipe runs through the through holes of the fins.

During operation, the heat of the electronic component is transferred from the evaporation section of the heat pipe to the condensation of the heat pipe, and then transferred to the fins of the heat sink. The fan is configured to generate an airflow which flows through the air passage channels of the heat sink to take away the heat of the fins. However, when the airflow flows through the air passage channels of the heat sink, the airflow can not reach a leeward side of the condensation section of the heat pipe because the airflow is blocked by the condensation section. A hot swirl is accordingly formed at the leeward side of the condensation section of the heat pipe. Thus, a portion of the fins at the leeward side of the condensation section of the heat pipe cannot exchange heat efficiently and adequately with the airflow of the fan, causing a relatively high temperature occurred at the leeward side of the condensation section. As a result, the heat dissipation efficiency of the heat dissipation device is decreased.

What is desired, therefore, is a heat dissipation device which can overcome the above described shortcomings.

DETAILED DESCRIPTION

Figure 1:
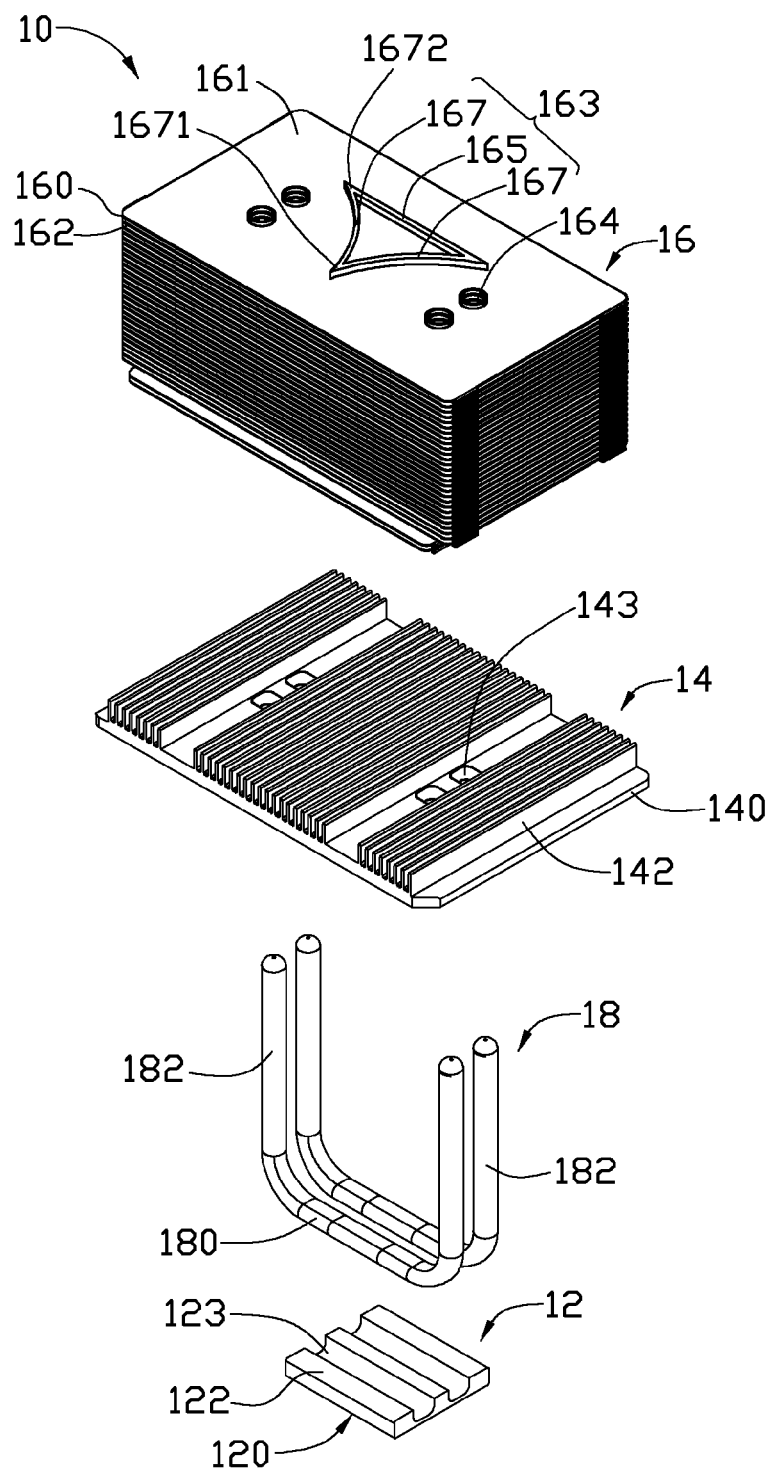
FIG. 1 is an exploded, isometric view of a heat dissipation device in accordance with an embodiment of the present disclosure.

Reference will now be made to the drawing figures to describe the present disclosure in detail.

Figure 2:
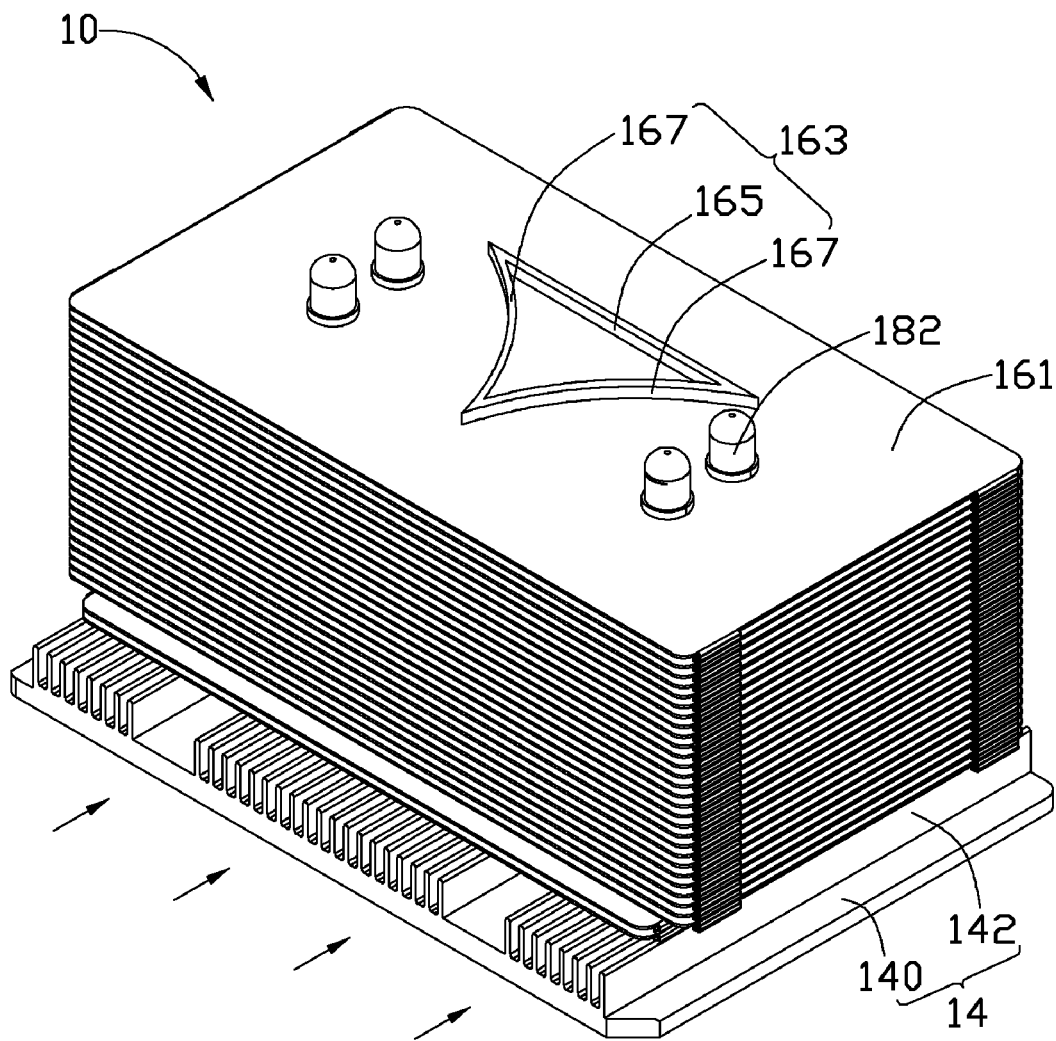
FIG. 2 is an assembled, isometric view of the heat dissipation device of FIG. 1.

Referring to FIGS. 1-2, a heat dissipation device 10 in accordance with an embodiment of the present disclosure is shown. The heat dissipation device 10 includes a heat absorbing plate 12, a first heat sink 14 above the heat absorbing plate 12, a second heat sink 16 above the first heat sink 14, and two heat pipes 18 thermally connecting the heat absorbing plate 12 and the second heat sink 16. The first heat sink 14 is located between the second heat sink 16 and the heat absorbing plate 12 and thermally connects to the heat absorbing plate 12 and the heat pipes 18.

The heat absorbing plate 12 has a rectangular plate-shaped profile and is provided with a flat lower surface 120 and a flat upper surface 122 opposite to the lower surface 120. The upper surface 122 defines two grooves 123 therein. The two grooves 123 are parallel to each other and extend between two opposite lateral sides of the upper surface 122 of the heat absorbing plate 12. In this embodiment, each of the grooves 123 extends from a left lateral side of the upper surface 122 to a right lateral side of the upper surface 122.

The first heat sink 14 is attached on the upper surface 122 of the heat absorbing plate 12. The first heat sink 14 includes a base plate 140 and a plurality of first fins 142 extending upwardly and perpendicularly from the base plate 140. The base plate 140 is rectangular and plate-shaped, and has a size larger than that of the heat absorbing plate 12. The base plate 140 defines two pairs of first through holes 143 therein, wherein one pair of the through holes 143 is located above the left side of the heat absorbing plate 12 and the other pair of the through holes 143 is located above the right side of the heat absorbing plate 12.

The second heat sink 16 is positioned above the first heat sink 14 and includes a plurality of second fins 160 stacked together along a bottom-to-up direction. The second fins 160 are plate-shaped and parallel to each other. The second fins 160 are parallel to the heat absorbing plate 12 and the base plate 140 of the first heat sink 14. An air passage channel 162 is defined between every two adjacent second fins 160. Each of the second fins 160 includes a main plate 161 and an air guiding member 163 formed at a middle portion of the main plate 161. The main plate 161 is rectangular and defines two pairs of second through holes 164 therein. Each pair of second through holes 164 of the second fins 160 are aligned with a corresponding pair of first through holes 143 of the base plate 140 of the first heat sink 14. The air guiding member 163 is located between the two pairs of second through holes 164 of the main plate 161, and protrudes upwardly and perpendicularly from the main plate 161. A height that the air guiding member 163 protrudes up from the main plate 161 of one fin 160 is less than a width of the air passage channel 162, whereby a top of the air guide member 163 is spaced a little from an adjacent above fin 160. The air guiding member 163 is substantially triangular in shape, and includes a straight bar 165 and two curved bars 167. The straight bar 165 and the two curved bars 167 are connected with each other end to end to form a triangular ring. The straight bar 165 is located at a back side of the two pair of second through holes 164 and extends along the main plate 161 from a position adjacent to one pair of the second through holes 164 to a position near the other pair of the second through holes 164. The two curved bars 167 are symmetric about a midline between the two pair of second through holes 164. Each of the two curved bars 167 includes a windward end 1671 and a leeward end 1672 at two opposite ends thereof. Each of the two curved bars 167 faces a corresponding pair of second through holes 164. The windward ends 1671 of the two curved bars 167 intersect at a middle of the second fin 160. The leeward ends 1672 of the two curved bars 167 extend to the back side of the two pair of second through holes 164 and respectively intersect with two opposite ends of the straight bar 165.

The two heat pipes 18 are substantially U-shaped. Each of the two heat pipes 18 includes an evaporation section 180 and two condensation sections 182 extending upwardly and perpendicularly from two opposite ends of the evaporation section 180.

In assembly of the heat dissipation device 10, the evaporation sections 180 of the two heat pipes 18 are respectively received in the two grooves 123 of the heat absorbing plate 12, and the condensation sections 182 of the two heat pipes 18 protrude upwardly. The first heat sink 14 is then placed on the heat absorbing plate 12 with the base plate 140 thereof attached on the upper surface 122 of the heat absorbing plate 12. The condensation sections 182 of the two heat pipes 18 extend respectively through the two pairs of first through holes 143 of the first heat sink 14. The second heat sink 16 is then placed on the first heat sink 14, and the condensation sections 182 of the two heat pipes 18 extend respectively into the two pairs of second through holes 164 of the second heat sink 16.

Figure 3:
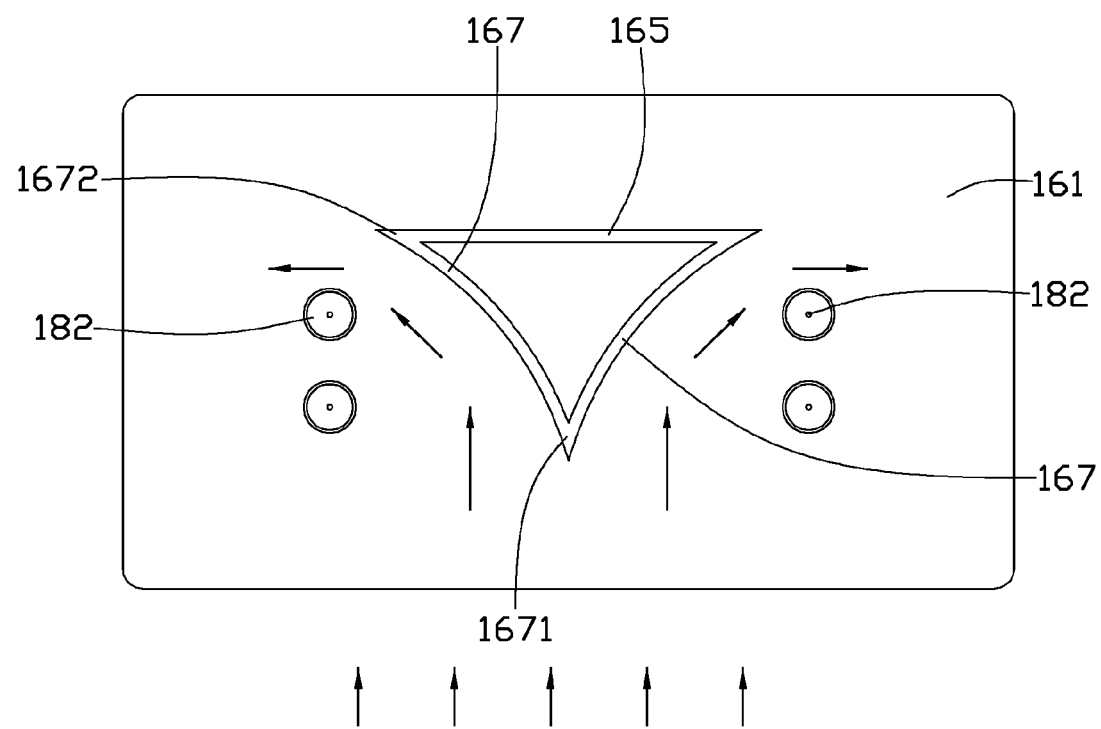
FIG. 3 is a schematic view of an airflow directions on a fin of the heat dissipation device.

Referring to FIG. 3, in use, an airflow (designated by the arrows) generated by a fan (not shown) flows along a direction from the windward ends 1671 of the two curved bars 167 to the leeward ends 1672 of the two curved bars 167. A portion of the airflow directly flows through the air passage channels 162 of the second heat sink 16 and the first heat sink 14 to take away the heat of the heat dissipation device 10. Another portion of the airflow is guided by the curved bars 167 to flow from the windward ends 1671 to the leeward ends 1672 of the curved bars 167, such that the airflow is guided to a leeward side of the condensation sections 182 of the heat pipes 18, whereby the portion of the second fins 16 behind the leeward side of the condensation sections 182 of the heat pipes 16 can be quickly cooled, and accordingly, the hot swirl behind the leeward side of the condensation sections 182 of the heat pipes 18 is thus eliminated.

In the present heat dissipation device 10, the straight bar 165 of the air guiding member 163 is located at a leeward side of the airflow and perpendicular to a flow direction of the airflow. The two curved bars 167 are located in the middle portion of each second fin 160 and disposed between the condensation sections 182 of the heat pipes 18. The windward ends 1671 of the two curved bars 167 are converged at a windward side of the airflow. The two curved bars 167 expand outwardly from the windward side towards the leeward side of the airflow and the leeward ends 1672 of the curved bars 167 are respectively connected to the opposite ends of the straight bar 165. As a result, the airflow can be guided smoothly by the curved bars 167 of the air guiding member 163 to the back side of the condensation sections 182 of the heat pipes 18. A heat dissipation efficiency of the heat dissipation device 10 is thus greatly increased.

It is to be understood, however, that even though numerous characteristics and advantages of the present disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A heat dissipation device, comprising:
a heat sink comprising a plurality of fins overlapped with each other, an air passage channel being defined between every two adjacent fins for an airflow flowing therethrough, each of the fins defining two or more through holes therein, each of the fins comprising a main plate and an air guiding member formed at a middle portion on the main plate, the air guiding member comprising two curved bars and a straight bar, the two curved bars being located between the two or more through holes, the two curved bars extending slantwise on the main plate to respective back sides of the two or more through holes, each of the curved bars comprising a windward end and a leeward end at two opposite ends thereof, the windward ends of the two curved bars facing the airflow, and the leeward ends of the two curved bars extending to the respective back sides of the at least two through holes, the straight bar connecting between the leeward ends of the two curved bars, the straight bar and the two curved bars being connected together to form an approximately triangular closed loop structure, the air guiding member protrudes upwardly and perpendicularly from the main plate, is less than a width of the air passage channel, a top of the air guiding member is spaced from an adjacent above fin; and
at least one heat pipe extending through the two or more through holes.
2. The heat dissipation device of claim 1, wherein the air guiding member extends upwardly from the main plate of each fin, and a height of the air guiding member above the main plate of the fin is less than a width of the air passage channel.
3. The heat dissipation device of claim 1, wherein the windward ends of the two curved bars intersect with each other.
4. The heat dissipation device of claim 3, wherein the two curved bars are symmetric about a midline between the two or more through holes, and the windward ends of the two curved bars intersect at the midline.
5. A heat dissipation device, comprising:
a heat sink comprising a plurality of fins stacked together, an air passage channel being defined between every two adjacent fins for an airflow flowing therethrough, each of the fins defining at least two through holes therein for extension of condensation sections of at least one heat pipe, each of the fins comprising a main plate and an air guiding member formed at a middle portion on the main plate, the air guiding member being located between the at least two through holes and comprising two curved bars and a straight bar, the two curved bars each having a first end and an opposite second end, the first ends of the two curved bars being converged at a windward side of the airflow, the two curved bars expanding outwardly from the windward side towards a leeward side of the airflow, the second ends of the two curved bars being extended to respective back sides of the at least two through holes, the straight bar connecting between the second ends of the two curved bars, the straight bar being located at the leeward side of the airflow and perpendicular to a flow direction of the airflow at the windward side, and the straight bar and the two curved bars being connected together to form an approximately triangular closed loop structure, the air guiding member protrudes upwardly and perpendicularly from the main plate, is less than a width of the air passage channel, a top of the air guiding member is spaced from an adjacent above fin.

6. A heat dissipation device, comprising:

a heat absorbing plate;

a first heat sink comprising a plurality of first fins, the first heat sink located above the heat absorbing plate;

a second heat sink above the first heat sink, the second heat sink comprising a plurality of second fins overlapped with each other, an air passage channel being defined between every two adjacent second fins for an airflow flowing therethrough, each of the second fins defining at least one pair of through holes therein, each of the second fins comprising a main plate and an air guiding member formed at a middle portion on the main plate, the air guiding member comprising two curved bars and a straight bar, the two curved bars being located between the two or more through holes, the two curved bars extending slantwise on the main plate to respective back sides of the at least one pair of through holes, each of the curved bars comprising a windward end and a leeward end at two opposite ends thereof, the windward ends of the two curved bars facing the airflow, and the leeward ends of the two curved bars extending to the respective back sides of the at least one pair of through holes, the straight bar connecting between the leeward ends of the two curved bars, the straight bar and the two curved bars being connected together to form an approximately triangular closed loop structure, the air guiding member protrudes upwardly and perpendicularly from the main plate, is less than a width of the air passage channel, a top of the air guiding member is spaced from an adjacent above fin; and at least one heat pipe extending through the at least one pair of through holes, the at least one heat pipe thermally connecting the heat absorbing plate, the first heat sink and the second heat sink.

7. The heat dissipation device of claim 6, wherein the first heat sink comprises a base plate, and the plurality of first fins extend upwardly and perpendicularly from the base plate.

8. The heat dissipation device of claim 7, wherein the base plate defines at least one pair of through holes therein, and the at least one heat pipe passes through the at least one pair of through holes of the base plate.

9. The heat dissipation device of claim 8, wherein the second fins are parallel to the heat absorbing plate and the base plate of the first heat sink.

10. The heat dissipation device of claim 6, wherein the two curved bars are directly connected, and the two curved bars are both concave.

* * * * *